(12) United States Patent
Yoon et al.

(10) Patent No.: US 11,659,753 B2
(45) Date of Patent: May 23, 2023

(54) WAVELENGTH CONTROL FILM AND DISPLAY DEVICE

(71) Applicant: LG Display Co., Ltd., Seoul (KR)

(72) Inventors: Jisu Yoon, Paju-si (KR); JeBeom Park, Paju-si (KR); DongRyul Jung, Paju-si (KR); Jiseok Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 315 days.

(21) Appl. No.: 16/921,481

(22) Filed: Jul. 6, 2020

(65) Prior Publication Data

US 2021/0043691 A1 Feb. 11, 2021

(30) Foreign Application Priority Data

Aug. 8, 2019 (KR) ......................... 10-2019-0096516

(51) Int. Cl.
| | | |
|---|---|---|
| *H10K 59/38* | (2023.01) | |
| *H10K 50/86* | (2023.01) | |
| *G02B 5/22* | (2006.01) | |
| *H01L 27/32* | (2006.01) | |
| *H01L 51/52* | (2006.01) | |

(52) U.S. Cl.
CPC ........ *H01L 27/322* (2013.01); *H01L 51/5284* (2013.01); *G02B 5/22* (2013.01)

(58) Field of Classification Search
None
See application file for complete search history.

(56) References Cited

U.S. PATENT DOCUMENTS

| | | | |
|---|---|---|---|
| 2014/0183480 A1* | 7/2014 | Lee | ...................... H01L 27/3213 |
| | | | 438/35 |
| 2018/0197921 A1* | 7/2018 | Kim | ...................... G06F 3/0412 |
| 2020/0106041 A1* | 4/2020 | Lee | ...................... H01L 27/3211 |
| 2020/0168668 A1* | 5/2020 | Kim | ...................... H01L 51/5271 |
| 2020/0185655 A1* | 6/2020 | Jo | ...................... H01L 51/5284 |
| 2021/0376272 A1* | 12/2021 | You | ...................... H01L 51/5036 |

\* cited by examiner

*Primary Examiner* — Nduka E Ojeh
(74) *Attorney, Agent, or Firm* — Fenwick & West LLP

(57) ABSTRACT

Embodiments of the disclosure relate to a wavelength control film and a display device. A wavelength control layer for absorbing part of light of a specific wavelength band is disposed on an outer surface of a transparent substrate of the display device to enable a correction to the color temperature of white light, thus allowing for high-efficiency driving and a high color gamut upon implementing white light. Further, adjustment of the light absorption peak wavelength and transmittance of the light absorption material included in the wavelength control film enables wavelength control, with the characteristics of the light emitting element considered, and reduce external light reflectivity to thus provide the functions of a polarization plate.

16 Claims, 14 Drawing Sheets

FIG.4

<pixel compensation>

| | SP_W | SP_B | Final Target White |
|---|---|---|---|
| spectrum | | | |
| White color temperature [K] (Wx, Wy) | 6000K~7,000K (0.346, 0.358) | | 10,000K (0.281, 0.288) |
| driving current | 100% | 40% | 140% |
| brightness | 100% | 10% | 110% |

<optical compensation>

| | SP_W | wavelength control layer | Final Target White |
|---|---|---|---|
| spectrum | | | |
| White color temperature [K] (Wx, Wy) | 6000K~7,000K (0.346, 0.358) | Cx, Cy coordinates controllable | 10,000K (0.281, 0.288) |
| driving current | 140% | – | 140% |
| brightness | 163% | – | 146% |

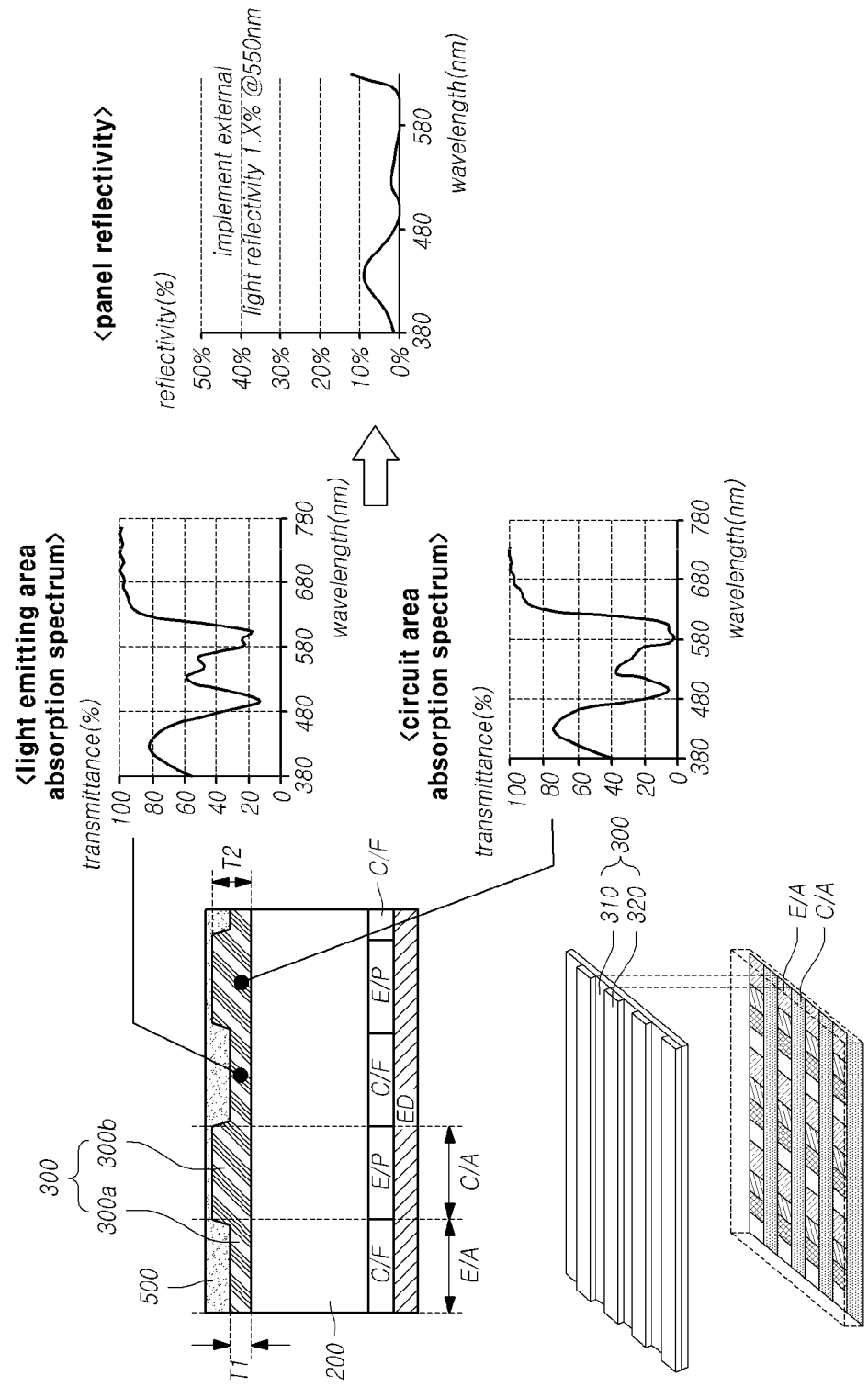

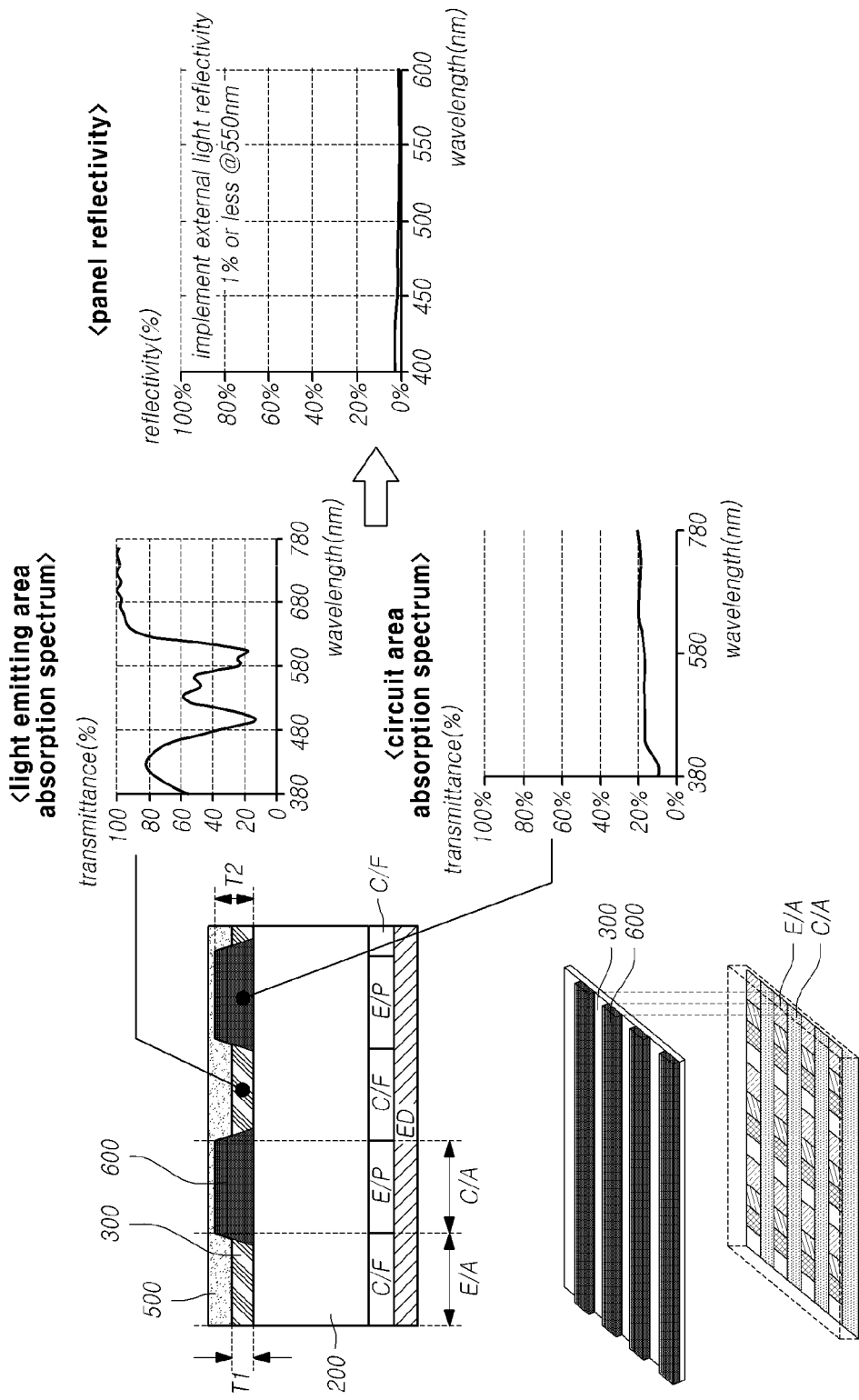

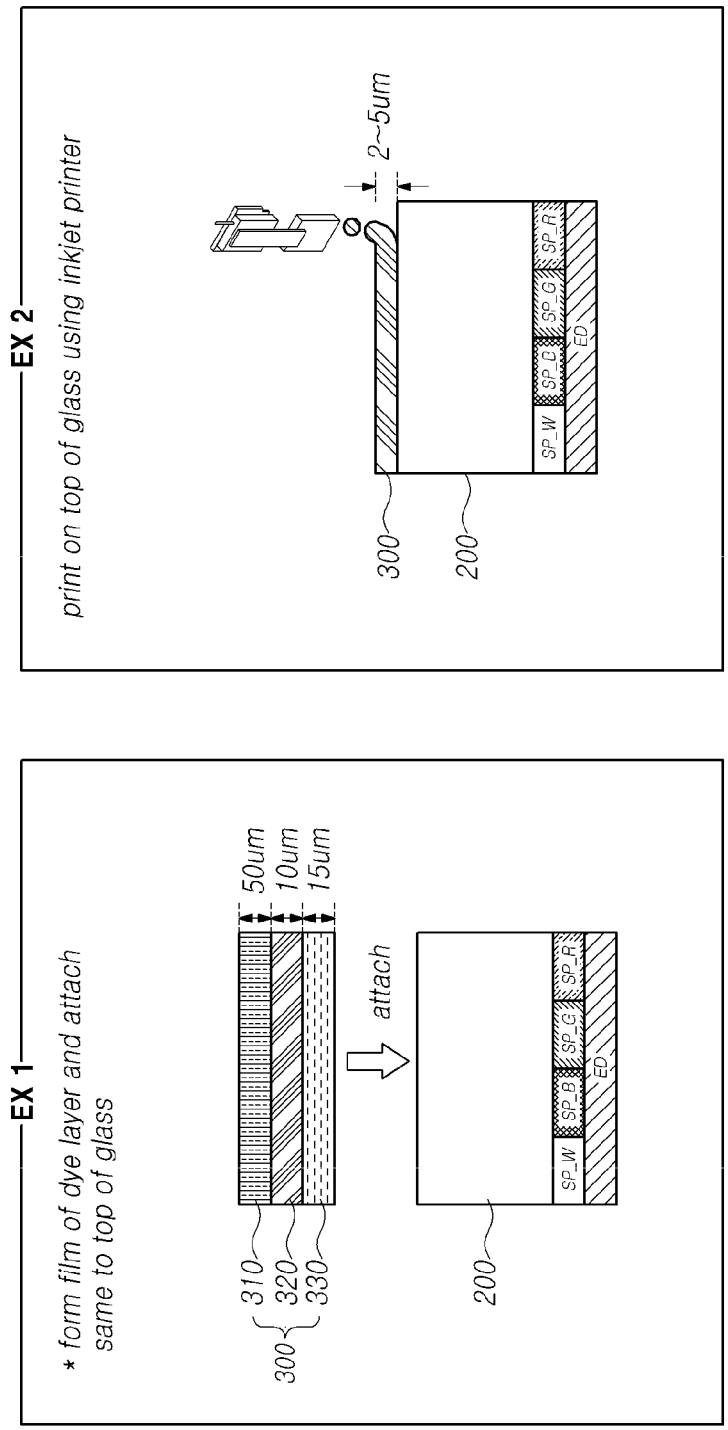

WAVELENGTH CONTROL FILM AND DISPLAY DEVICE

CROSS-REFERENCE TO RELATED APPLICATION

This application claims priority from Republic of Korea Patent Application No. 10-2019-0096516, filed on Aug. 8, 2019, which is hereby incorporated by reference in its entirety.

BACKGROUND

Field

Embodiments of the disclosure relate to a wavelength control film and a display device.

Description of Related Art

The growth of the intelligent society leads to increased demand for image display devices and use of various types of display devices, such as liquid crystal displays, organic light emitting displays, etc.

A display device includes a display panel with a plurality of gate lines, a plurality of data lines, and a plurality of subpixels and may display images by adjusting the brightness of the subpixels driven via the gate lines and the data lines.

The plurality of subpixels may include red, green, and blue subpixels and, in some cases, may further include white subpixels. To represent white, all of the red, green, and blue subpixels or some subpixels including white subpixels may be driven.

It may be difficult to increase the color gamut depending on the characteristics of the color conversion layer or elements disposed in the subpixel, and increasing the color gamut by a driving scheme may lower the brightness relative to power consumption, resultantly deteriorating the driving efficiency of the display device.

SUMMARY

Embodiments of the disclosure may provide a display device that may increase the color gamut of the display panel, reduce power consumption, and enhance brightness by controlling the wavelength of the light emitted from the display panel.

Embodiments of the disclosure may provide a display device that eliminates the need for a polarization plate by lowering the reflectivity of external light while enhancing the color gamut of the display panel by wavelength control.

According to embodiments of the disclosure, there is provided a display device, comprising, a plurality of subpixels including a light emitting area and a circuit area, a transparent substrate positioned on a path along which light from the subpixel is emitted to an outside, and a wavelength control layer disposed in at least a partial area on the transparent substrate and including at least one light absorption material. Each of the at least one light absorption material represents a light absorption spectrum with a light absorption peak wavelength.

The wavelength control layer may include a plurality of light absorption materials. The plurality of light absorption materials may have different light absorption peak wavelengths and different transmittances at light absorption peak wavelength.

The wavelength control layer may include a first portion positioned on the light emitting area and a second portion positioned on the circuit area. A largest thickness of the first portion may be smaller than a largest thickness of the second portion.

The wavelength control layer may be positioned on the light emitting area. A light blocking layer having a lower transmittance than the wavelength control layer may be disposed on the circuit area. The light blocking layer may be not smaller in thickness than the wavelength control layer.

The plurality of subpixels included in the display device may include a white subpixel, a red subpixel, a green subpixel, and a blue subpixel. The wavelength control layer may be disposed on the white subpixel.

In such a case, a polarization plate may be disposed on the wavelength control layer. A planarization layer may be disposed between the wavelength control layer and the polarization plate.

According to embodiments of the disclosure, there is provided a display device, comprising, a plurality of subpixels including a light emitting area and a circuit area, a transparent substrate positioned on a path along which light from the subpixel is emitted to an outside, and a wavelength control layer disposed in at least a partial area on the transparent substrate and including a plurality of light absorption materials. Each of the plurality of light absorption materials represents a light absorption spectrum with a light absorption peak wavelength. The plurality of light absorption materials have different light absorption peak wavelengths and different transmittances at light absorption peak wavelength.

According to embodiments of the disclosure, there is provided a display device, comprising, a plurality of subpixels including a white subpixel, a red subpixel, a green subpixel, and a blue subpixel, a light emitting element disposed in each of the plurality of subpixels, a transparent substrate positioned on a path along which light from the subpixel is emitted to an outside, a wavelength control layer disposed on the transparent substrate and on the white subpixel and including at least one light absorption material, each of the at least one light absorption material representing a light absorption spectrum with a light absorption peak wavelength, and a polarization plate positioned on the wavelength control layer.

According to embodiments of the disclosure, there is provided a wavelength control film, comprising a first light absorption material absorbing at least a portion of light of a first wavelength band and a second light absorption material absorbing at least a portion of light of a second wavelength band different from the first wavelength band, wherein a transmittance of the first light absorption material, for the light of the first wavelength band, differs from a transmittance of the second light absorption material, for the light of the second wavelength band.

According to embodiments of the disclosure, a wavelength control layer including a light absorption material with the nature of absorbing a specific wavelength band of light is disposed on the transparent substrate of the display panel, enhancing the color gamut and increasing the brightness relative to power consumption by controlling the wavelength of the light emitted from the display panel.

According to embodiments of the disclosure, the wavelength control layer includes a plurality of light absorption materials that have different light absorption peak wavelengths and different transmittances at the light absorption peak wavelengths and may thereby enhance the color gamut and reduce external light reflectivity, thereby eliminating the need for a polarization plate.

BRIEF DESCRIPTION OF DRAWINGS

The above and other objects, features, and advantages of the disclosure will be more clearly understood from the following detailed description, taken in conjunction with the accompanying drawings, in which:

FIGS. 4 and 5 are views illustrating example schemes of implementing white by a display device including a wavelength control layer according to embodiments of the disclosure;

FIG. 12 is a view illustrating an example structure in which a wavelength control layer is disposed according to embodiments of the disclosure;

FIG. 13 is a view illustrating another example structure in which a wavelength control layer is disposed according to embodiments of the disclosure; and FIG. 14 is a view illustrating example schemes of disposing a wavelength control layer according to embodiments of the disclosure.

DETAILED DESCRIPTION

Figure 1:
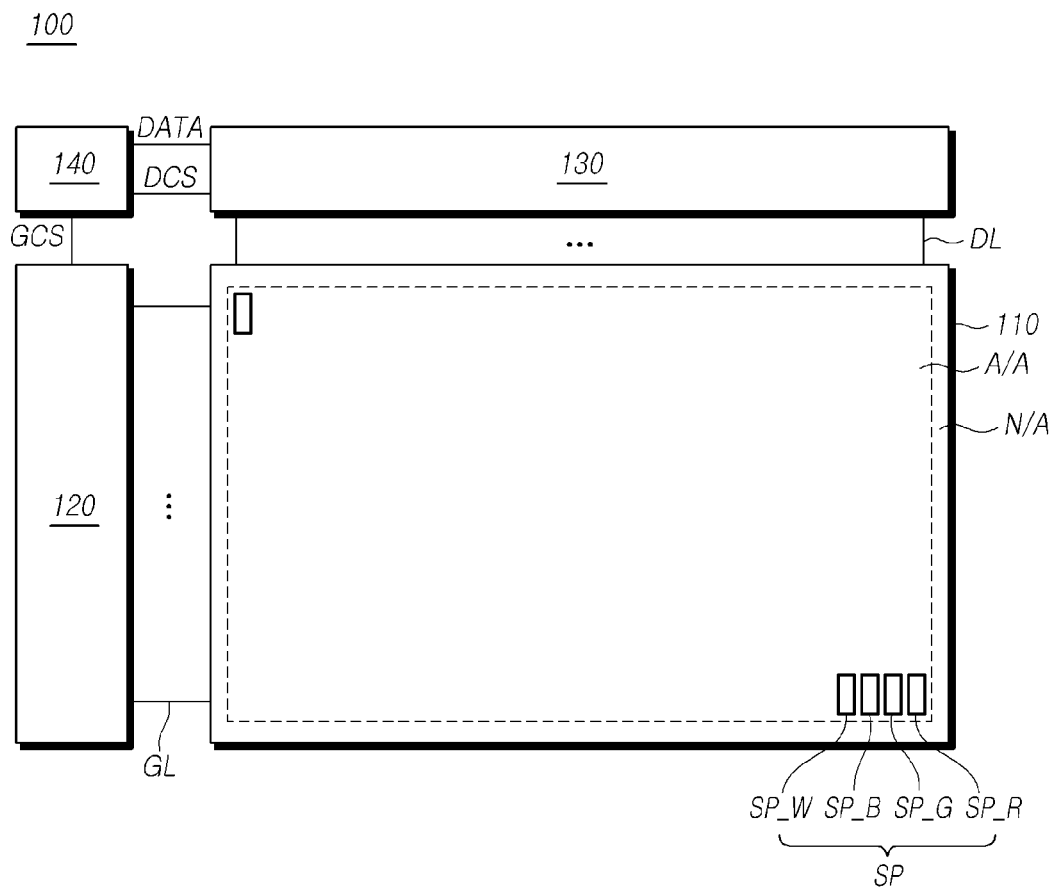
FIG. 1 is a view schematically illustrating an example configuration of a display device according to various embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a view schematically illustrating an example configuration of a display device 100 according to embodiments of the disclosure.

Referring to FIG. 1, a display device 100, according to embodiments of the disclosure, may include a display panel 110 including an active area A/A, in which a plurality of subpixels SP are arranged, and a non-active area N/A around the active area A/A, a gate driving circuit 120, a data driving circuit 130, and a controller 140 for driving the display panel 110.

The display panel 110 may include a plurality of gate lines GL, a plurality of data lines DL, and subpixels SP at the crossings of the gate lines GL and the data lines DL.

The gate driving circuit 120 may be controlled by the controller 140 to sequentially output scan signals to the plurality of gate lines GL disposed in the display panel 110, controlling the driving timing of the subpixels SP.

The gate driving circuit 120 may include one or more gate driver integrated circuits (GDICs). Depending on driving schemes, the gate driving circuit 120 may be positioned on only one side, or each of two opposite sides, of the display panel 110. The gate driving circuit 120 may be implemented in a gate-in-panel (GIP) form which is embedded in the bezel area of the display panel 110.

The data driving circuit 130 receives image data from the controller 140 and converts the image data into an analog data voltage. The data driving circuit 130 outputs a data voltage to each data line DL according to the timing of applying a scan signal via the gate line GL, allowing each subpixel SP to represent a brightness according to the image data.

The data driving circuit 130 may include one or more source driver integrated circuits (SDICs).

The controller 140 supplies various control signals to the gate driving circuit 120 and the data driving circuit 130 and controls the operation of the gate driving circuit 120 and the data driving circuit 130.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system), various timing signals including a vertical synchronization signal VSYNC, a horizontal synchronization signal HSYNC, an input data enable signal DE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits GDICs constituting the gate driving circuit 120. The gate shift clock GSC is a clock signal commonly input to one or more gate driver integrated circuits GDICs and controls the shift timing of the scan signals. The gate output enable signal GOE designates timing information about one or more gate driver integrated circuits GDICs.

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits SDICs constituting the data driving circuit 130. The source sampling clock SSC is a clock signal for controlling the sampling timing of data in each source driver integrated circuit (SDIC). The source output enable signal SOE controls the output timing of the data driving circuit 130.

The display device 100 may further include a power management integrated circuit that supplies various voltages or currents to, e.g., the display panel 110, the gate driving circuit 120, and the data driving circuit 130 or controls various voltages or currents to be supplied.

Each subpixel SP may be disposed in an area defined by the crossing of the gate line GL and the data line DL, and liquid crystals or a light emitting element ED may be disposed in each subpixel SP depending on the type of the display device 100.

As an example, when the display device 100 is a liquid crystal display device, the display device 100 may include a light source device, such as a backlight unit, to emit light to the display panel 110. Liquid crystals are disposed in the subpixel SP of the display panel 110. The alignment of liquid crystals may be adjusted by an electric field created as data voltage is applied to each subpixel SP, thereby representing a brightness per image data and displaying an image.

As another example, when the display device 100 is an organic light emitting display device, an organic light emitting diode (OLED) may be disposed in each subpixel SP. The brightness represented by each subpixel SP may be controlled by controlling the current flowing through the organic light emitting diode (OLED).

In some cases, a light emitting diode (LED) or micro light emitting diode (pLED) may be disposed in each subpixel SP.

A color conversion material (or wavelength conversion material), such as a color filter or quantum dot, may be disposed in each subpixel SP, allowing each subpixel SP to represent light of a wavelength band corresponding to a specific color. In other words, the subpixels SP disposed on the display panel 110 may include a red subpixel SP_R, a green subpixel SP_G, and a blue subpixel SP_B.

The display device 100 may include a subpixel SP, where no color filter is disposed to increase the brightness represented by the display panel 110, e.g., a white subpixel SP_W which emits light of a white wavelength band.

Thus, when the display device 100 displays white, the white subpixel SP_W alone may be driven or, in some cases, another subpixel SP may also be driven in addition to the white subpixel SP_W to adjust the color temperature of white light. In this case, a white light of spectrum may be implemented but, as the other subpixel SP is also driven, the brightness relative to power consumption may be lowered.

According to embodiments of the disclosure, there is provided a display device 100 which may enhance the brightness relative to power consumption while easily representing the spectrum of white light by disposing a layer for controlling the wavelength of light on the surface where images are displayed in the display panel 110.

Figure 2A:
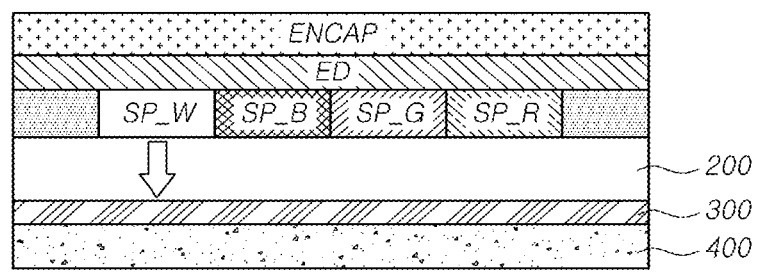
FIGS. 2A and 2B are cross-sectionals view schematically illustrating structures of a display device including a wavelength control layer according to embodiments of the disclosure.
Figure 2B:
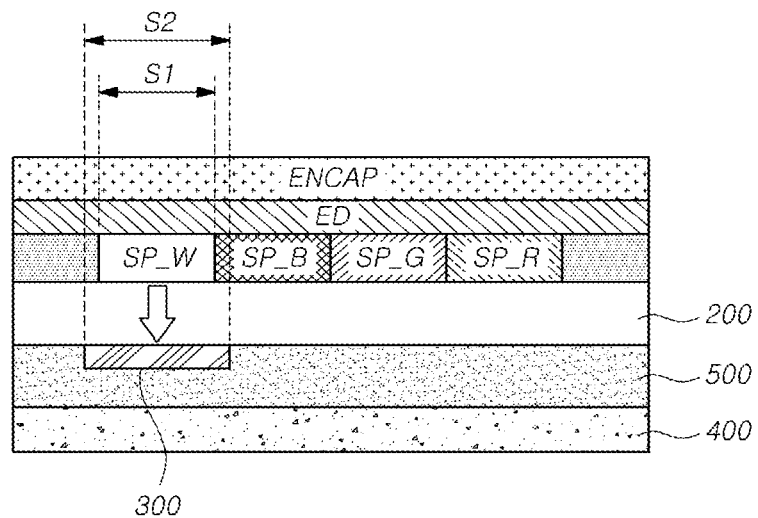

FIGS. 2A and 2B are cross-sectional views schematically illustrating structures of a display device 100 including a wavelength control layer 300 according to embodiments of the disclosure.

Referring to FIG. 2, a display device 100 may include a light emitting element ED disposed in each subpixel SP and an encapsulation layer ENCAP disposed on the light emitting element ED to protect the light emitting element ED. The encapsulation layer ENCAP may have a stacked structure of one or more organic layers or inorganic layers or, in some cases, the encapsulation layer ENCAP may be formed of a metal.

Under the subpixel SP, a thin film transistor layer (not shown) where signal lines and various circuit elements for driving the subpixel SP are disposed may be present on the substrate.

Depending on its type, the display device 100 may emit light to the encapsulation layer ENCAP positioned over the subpixel SP to display images (front emission, top emission) or emit light to the thin film transistor layer (not shown) positioned under the subpixel SP to display images (back emission, bottom emission).

Although FIG. 2 illustrates a bottom-emission display device 100 in which the subpixel SP emits light to the bottom of the substrate to display images, embodiments of the disclosure may also apply where the display device 100 adopts the top emission structure.

The plurality of subpixels SP included in the display device 100 may include a white subpixel SP_W, a blue subpixel SP_B, a green subpixel SP_G, and a red subpixel SP_R. A transparent substrate 200 may be positioned on the path along which light from the subpixel SP is emitted to the outside. The transparent substrate 200 may be a substrate formed of a transparent material, e.g., glass. In other words, the transparent substrate 200 may mean a glass covering the surface where images are displayed in the display device 100.

A wavelength control layer 300 may be disposed on an outer surface of the transparent substrate 200. The wavelength control layer 300 may include at least one light absorption material. A polarization plate 400 may be positioned on the wavelength control layer 300.

The light absorption material included in the wavelength control layer 300 may have the property of absorbing a specific wavelength band of light and a transmittance (or absorption rate) for the specific wavelength band of light. As an example, the light absorption material included in the wavelength control layer 300 may have a predetermined transmittance for light of a wavelength band except for blue light. In other words, the light absorption material may represent a light absorption spectrum with an absorption peak wavelength and may transmit only part of the specific wavelength band of light. Here, the absorption peak wavelength may mean the wavelength at which the light absorption material has the highest absorption rate, i.e., the lowest transmittance.

As the wavelength control layer 300 is disposed on the path along which the light from the subpixel SP travels, the light emitted from the subpixel SP may undergo spectrum variation while passing through the wavelength control layer 300. In particular, in a case where the display panel 110 implements white light, the spectrum of the white light may be varied by the wavelength control layer 300 to raise the color temperature of the white light, thereby increasing the color gamut of the display panel 110. The placement of the wavelength control layer 300 allows the white subpixel SP_W alone to be driven to implement white, thereby reducing power consumption and increasing the brightness relative to power consumption.

The wavelength control layer 300 may be disposed on the entire transparent substrate 200 as in FIG. 2A. In such a case, the polarization plate 400 may be disposed on the wavelength control layer 300.

Since the wavelength control layer 300 is disposed on the entire transparent substrate 200 and the wavelength control layer 300 has the same transmittance/absorption characteristics even for incident light from the outside, the wavelength control layer 300 contributes to decreasing the external light reflectivity.

Alternatively, the wavelength control layer 300 may be disposed in a partial area on the transparent substrate 200 as in FIG. 2B and be disposed on the white subpixel SP_W. A polarization plate 400 may be positioned on the wavelength control layer 300. In this case, the polarization plate 400 on the wavelength control layer 300 may be disposed in contact with the wavelength control layer 300 and, in some cases, a planarization layer 500 may be disposed between the wavelength control layer 300 and the polarization plate 400.

As the wavelength control layer 300 is disposed on the white subpixel SP_W, the spectrum of the light emitted from the white subpixel SP_W may be varied by the wavelength control layer 300, thus leading to an increase in the color gamut of the white light.

In this case, the area S2 in which the wavelength control layer 300 is disposed may be larger than the area S1 of the corresponding white subpixel SP_W. The area S1 of the white subpixel SP_W may mean the size of the white subpixel SP_W itself or the size of the light emitting area E/A included in the white subpixel SP_W.

As such, when the wavelength control layer 300 is disposed on the white subpixel SP_W, the wavelength control layer 300 may be disposed so that the area of the wavelength control layer 300 is not smaller than the area of the white subpixel SP_W, considering the direction of the light emitted from the white subpixel SP_W.

Upon implementing white light, the wavelength control layer 300 disposed on the white subpixel SP_W may have the characteristic of absorbing a specific wavelength band of light to control wavelength.

Figure 3:
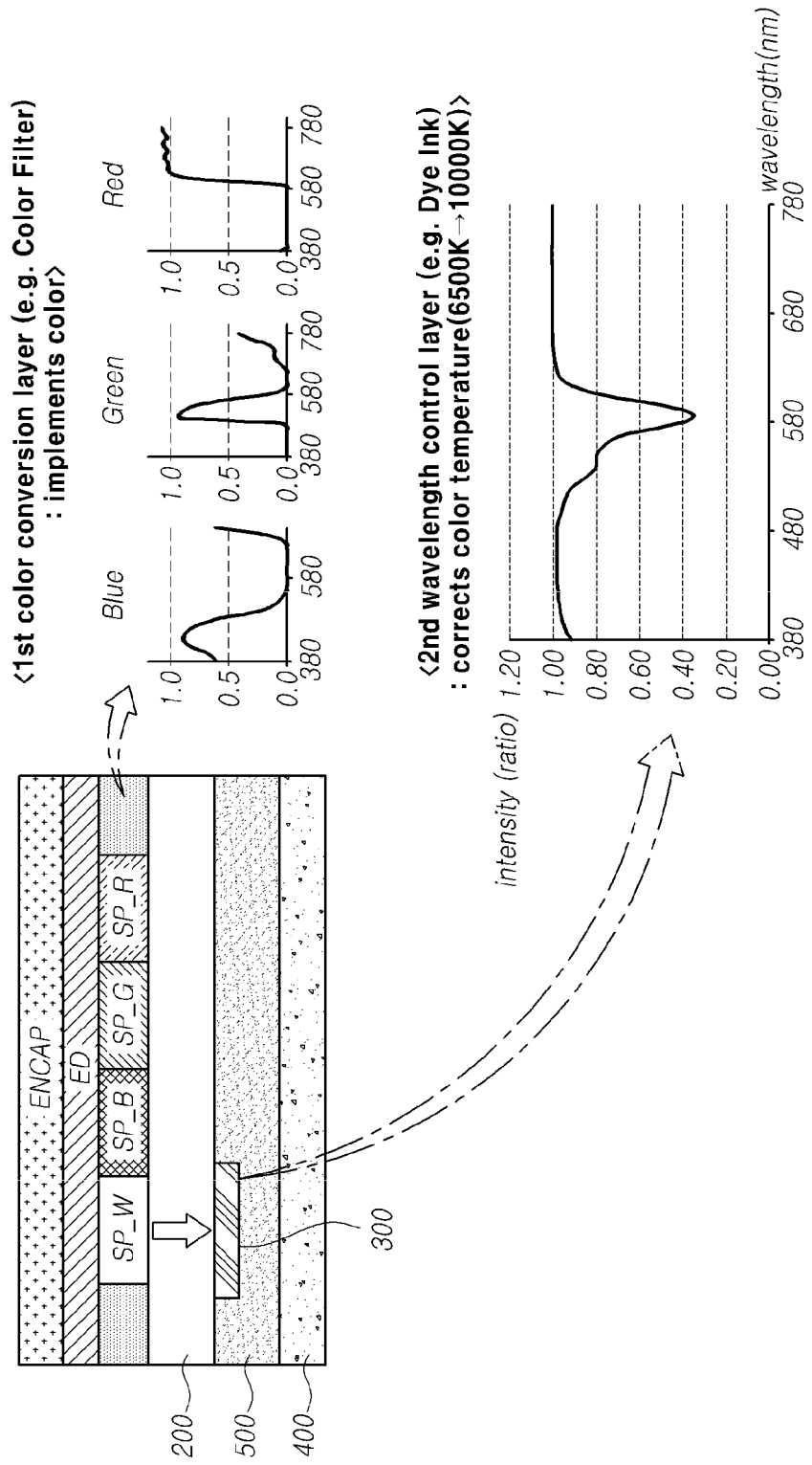
FIG. 3 is a view illustrating an example light absorption spectrum of a wavelength control layer according to embodiments of the disclosure.

FIG. 3 is a view illustrating an example light absorption spectrum of a wavelength control layer 300 according to embodiments of the disclosure.

Referring to FIG. 3, among the subpixels SP disposed in the display device 100, the red subpixel SP_R, green subpixel SP_G, and blue subpixel SP_B may include a color conversion material (or wavelength conversion material), such as a color filter. Thus, the subpixel SP may implement its intended color by adjusting the wavelength of light transmitted through the color filter.

No color conversion material, e.g., color filter, may be provided in the white subpixel SP_W. The wavelength control layer 300 may be disposed in the area corresponding to the white subpixel SP_W, on the transparent substrate 200.

The wavelength control layer 300 may include a light absorption material that may represent a predetermined transmittance for a specific wavelength band of light. As an example, the light absorption material may be a light absorption dye and may absorb at least a portion of light of a wavelength band ranging from 580 nm to 600 nm. In other words, the light absorption material may have a low transmittance (e.g., 30% to 40%) for light of a wavelength band ranging from 580 nm to 600 nm and represent a light absorption spectrum with a low transmittance at the light absorption peak wavelength. The light absorption material included in the wavelength control layer 300 may have the absorption wavelength band and transmittance adjusted depending on the light spectrum represented by the light emitting element ED disposed in the subpixel SP.

Thus, while the light emitted from the white subpixel SP_W passes through the wavelength control layer 300, some wavelength band of light may be absorbed according to the light absorption spectrum of the light absorption material included in the wavelength control layer 300, so that a changed light spectrum may be represented.

In other words, as the spectrum of the light emitted from the white subpixel SP_W is varied by the wavelength control layer 300, the spectrum of the white light may be corrected, so that the color temperature of the light emitted from the light emitting element ED disposed in the white subpixel SP_W may be increased (e.g., 6,500K→10,000K). As the color temperature of the white light is corrected, the color gamut of the white light may be enhanced.

Further, as the color gamut of the white light is increased by the wavelength control layer 300 disposed on the white subpixel SP_W, it is unnecessary to drive other subpixel SP, thus reducing power consumption and enhancing the brightness relative to power consumption.

Figure 5:
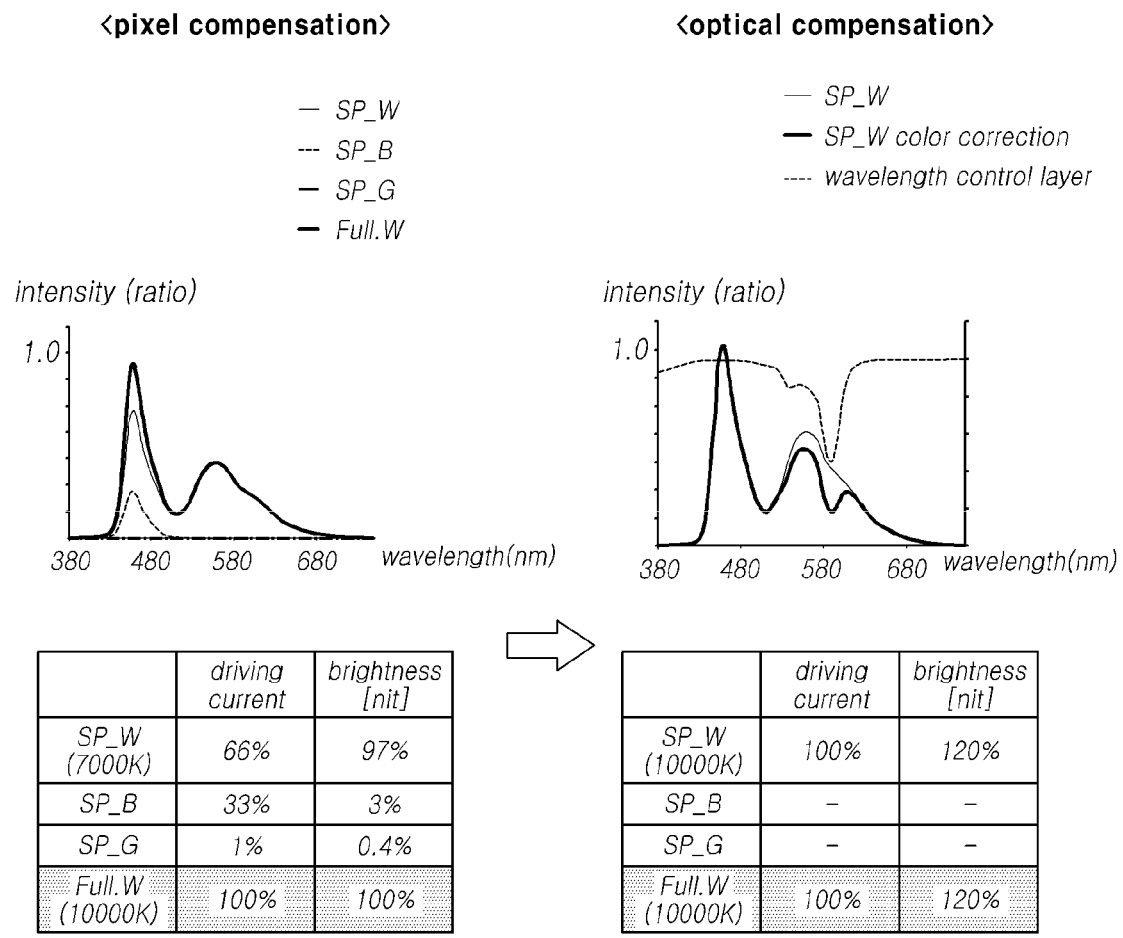

FIGS. 4 and 5 are views illustrating example schemes of implementing white by a display device 100 including a wavelength control layer 300 according to embodiments of the disclosure.

Referring to FIG. 4, upon representing white light, the display device 100 including the white subpixel SP_W may implement the spectrum of white light via a scheme of driving the white subpixel SP_W and other some subpixel SP (pixel compensation).

As an example, the display device 100 may supply a driving current to the white subpixel SP_W and may supply a driving current, which is smaller than the driving current supplied to the white subpixel SP_W, to the blue subpixel SP_B. In other words, the spectrum represented by the light emitted from the white subpixel SP_W and the spectrum represented by the light emitted from the blue subpixel SP_B may be mixed to implement the spectrum of white light (final target white).

In this case, as the blue subpixel SP_B is driven, the brightness relative to the consumed driving current may not increase. In other words, when the driving current supplied to the white subpixel SP_W is 100%, and the driving current supplied to the blue subpixel SP_B is 40%, only 10% of brightness increase may be attained by driving the blue subpixel SP_B. Thus, the increase in brightness relative to power consumption is low, and the efficiency may be deteriorated.

In contrast, according to embodiments of the disclosure, a driving current is supplied to the white subpixel SP_W to drive the white subpixel SP_W, and the spectrum of the light emitted from the white subpixel SP_W may be adjusted by the wavelength control layer 300 disposed on the white subpixel SP_W to thereby implement a spectrum of white light (optical compensation).

In this case, no driving current is supplied to the other subpixels SP than the white subpixel SP_W while a driving current may be supplied only to the white subpixel SP_W. Further, in some cases, although a driving current may be supplied to the other subpixels SP than the white subpixel SP_W, a very small amount of driving current may be supplied to the other subpixels SP as compared with the pixel compensation scheme, so that most of the driving current may be supplied to the white subpixel SP_W.

Thus, as white light is implemented by driving the white subpixel SP_W, the brightness may be increased in proportion to the driving current supplied to the white subpixel SP_W. Further, the color temperature may be corrected by varying the spectrum of the light emitted from the white subpixel SP_W by the wavelength control layer 300 disposed on the white subpixel SP_W, and a spectrum of white light may be implemented.

At this time, since no driving current is supplied to the other subpixels SP than the white subpixel SP_W, the same amount of driving current as the whole driving current supplied to the white subpixel SP_W and blue subpixel SP_B in the pixel compensation scheme may all be supplied to the white subpixel SP_W. The brightness representing the white light may be raised by increasing the amount of driving current supplied to the white subpixel SP_W. In other words, in the optical compensation scheme, a similar brightness to that in the pixel compensation scheme may be represented, and the driving current may be reduced and so is the power consumption. Further, in the optical compensation scheme, it is possible to raise the brightness while maintaining the same driving current as that in the pixel compensation scheme.

FIG. 5 illustrates another example of a pixel compensation scheme and an optical compensation scheme, in which although similar to the example of FIG. 4, the green subpixel SP_G may also be driven to implement white light in the pixel compensation scheme.

In the pixel compensation scheme, the white subpixel SP_W, the blue subpixel SP_B, and the green subpixel SP_G may be driven. At this time, the driving current supplied to the green subpixel SP_G may be very small. The spectrum of the light emitted from the white subpixel SP_W and the spectrum of the light emitted from, e.g., the blue subpixel SP_B and the green subpixel SP_G may be mixed together, implementing a spectrum of white light.

In contrast, in the optical compensation scheme, a driving current may be supplied only to the white subpixel SP_W, and the spectrum of the light emitted from the white subpixel SP_W may be corrected by the wavelength control layer 300 disposed on the white subpixel SP_W. That is, part of a specific wavelength band, of the light emitted from the white subpixel SP_W, may be absorbed by the wavelength control layer 300, so that the light spectrum may be changed from one with two peak wavelengths to one with three peak wavelengths.

As such, white light whose color temperature has been corrected may be implemented by changing the spectrum of the light emitted from the white subpixel SP_W via the wavelength control layer 300 and, as white light is implemented by driving the white subpixel SP_W, the brightness relative to power consumption may be increased.

Further, according to embodiments of the disclosure, the spectrum of white light represented by driving the white subpixel SP_W may be adjusted by adjusting the light absorption peak wavelength of the light absorption material included in the wavelength control layer 300 or the transmittance at the light absorption peak wavelength.

Figure 6:
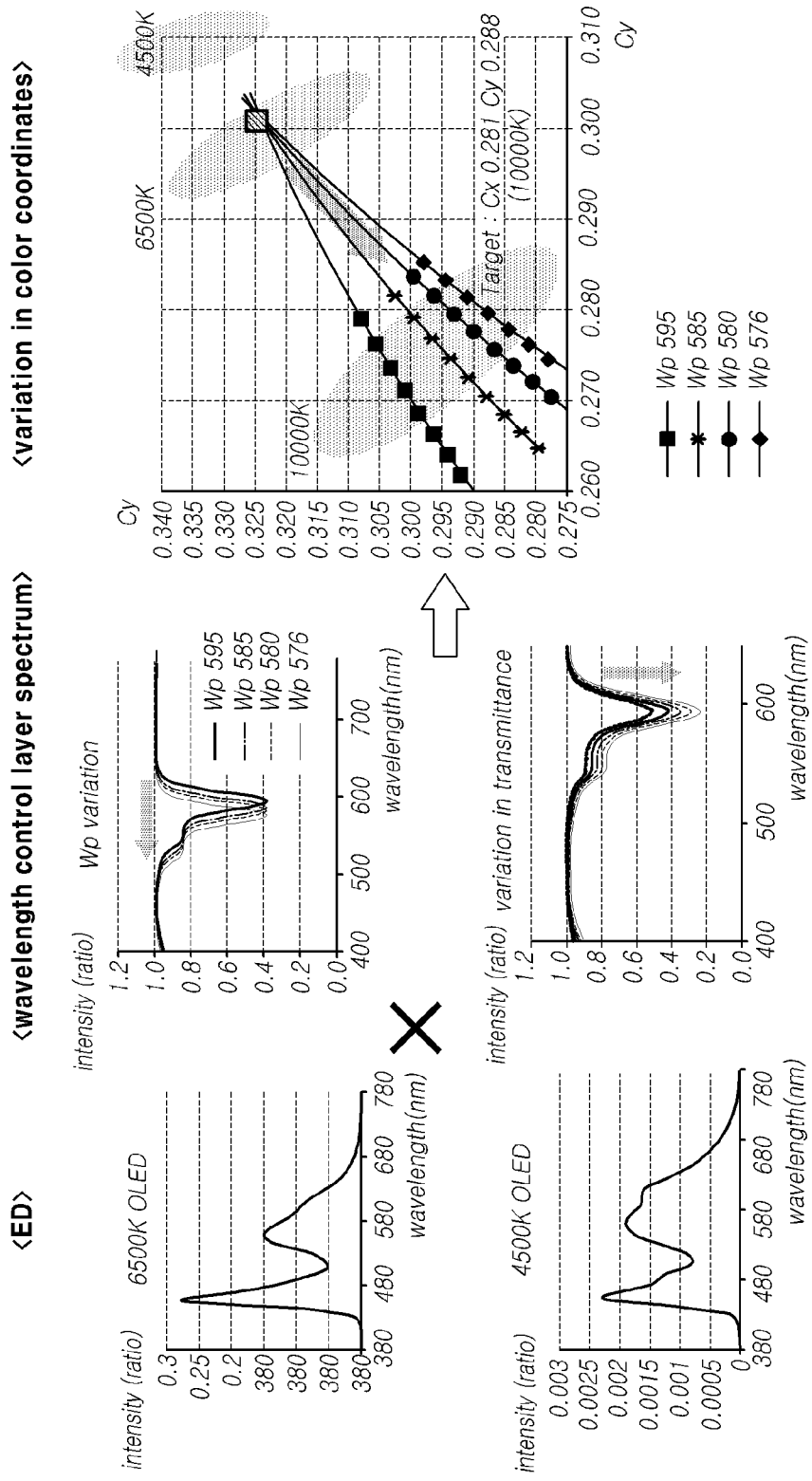
FIG. 6 is a view illustrating an example characteristic variation in a wavelength control layer as a light absorption material contained in the wavelength control layer is adjusted according to embodiments of the disclosure.

FIG. 6 is a view illustrating an example characteristic variation in a wavelength control layer 300 as a light absorption material contained in the wavelength control layer 300 is adjusted according to embodiments of the disclosure.

Referring to FIG. 6, the light absorption spectrum represented by the wavelength control layer 300 may have the light absorption peak wavelength and the transmittance at the light absorption peak wavelength varied depending on the light absorption material included in the wavelength control layer 300.

Wp595, Wp585, Wp580, and Wp576 are examples of the light absorption material, and the light absorption peak wavelength and the transmittance at the light absorption peak wavelength may be varied depending on, e.g., the kind of the light absorption material, the proportion of the light absorption material included in the wavelength control layer 300, or the thickness of the wavelength control layer 300. The color temperature and color coordinates of the white light represented as the wavelength control layer 300 is disposed may be adjusted to the required levels by adjusting, e.g., the light absorption peak wavelength or the transmittance.

In other words, the light emitting element ED disposed in the subpixel SP may represent a different light spectrum depending on the kind of the light emitting element ED. As an example, as shown in FIG. 6, an organic light emitting diode (OLED) with a color temperature of 6,500K and an organic light emitting diode (OLED) with a color temperature of 4,500K may represent different light spectra.

In this case, a correction necessary to represent a spectrum of white light required for the light spectrum represented by each light emitting element ED may be performed by adjusting the light absorption peak wavelength and transmittance of the wavelength control layer 300 disposed on the white subpixel SP_W.

As such, according to embodiments of the disclosure, the wavelength control layer 300 may be disposed on the white subpixel SP_W, reducing efficiency deterioration and implementing a spectrum of white light to thereby raise the color gamut. Further, the light absorption peak wavelength and transmittance represented by the wavelength control layer 300 may be adjusted, enabling a correction corresponding to the light spectrum of the light emitting element ED disposed in the white subpixel SP_W.

Further, the wavelength control layer 300 may include a plurality of light absorption materials, and each light absorption material may have a different light absorption peak wavelength and a different transmittance at light absorption peak wavelength.

Figure 7:
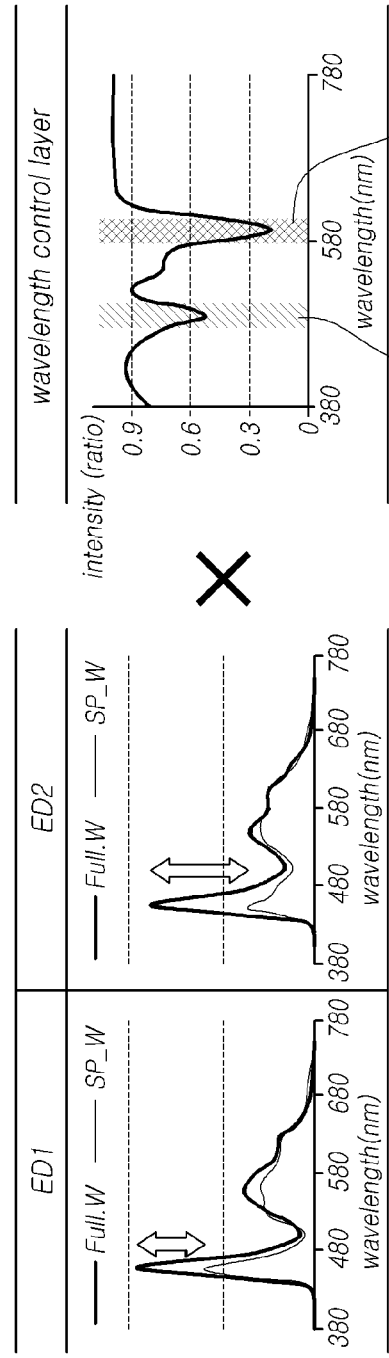
FIG. 7 is a view illustrating another example light absorption spectrum of a wavelength control layer according to embodiments of the disclosure.

FIG. 7 is a view illustrating another example light absorption spectrum of a wavelength control layer 300 according to embodiments of the disclosure.

Referring to FIG. 7, the wavelength control layer 300 may include a plurality of light absorption materials, e.g., two light absorption materials. The light absorption materials may represent different light absorption spectra.

In other words, the wavelength band of light absorbed by any one light absorption material may differ from the wavelength band of light absorbed by the other light absorption material. Further, the transmittance in the wavelength band of light absorbed by any one light absorption material may differ from the transmittance in the wavelength band of light absorbed by the other light absorption material.

Thus, as shown in FIG. 7, the wavelength control layer 300 may include two light absorption materials that have light absorption characteristics in a wavelength band as in ① and light absorption characteristics in a wavelength band as in ②. The transmittance in the wavelength band ① may differ from the transmittance in the wavelength band ②. The wavelength control layer 300 including two light absorption materials representing different light absorption spectra may have two different light absorption peak wavelengths and represent a different transmittance at each of the light absorption peak wavelengths.

As described above, the spectrum represented by the light emitted from the light emitting element ED and the color temperature may be varied depending on the type of the light emitting element ED. As in the example shown in FIG. 7, the light spectrum represented by the white subpixel SP_W where a first type of light emitting element ED1 is disposed may differ from the light spectrum represented by the white subpixel SP_W where a second type of light emitting element ED2 is disposed.

The wavelength control layer 300 includes a plurality of light absorption materials with different light absorption characteristics and, thus, the light absorption spectrum is adjusted by the wavelength control layer 300, so that wavelength control suited for the light spectrum of each light emitting element ED may be performed.

Thus, an increase in the color gamut of white light, and power savings with the brightness remaining the same may be achieved by placing the wavelength control layer 300 including a plurality of light absorption materials. Further, as a light absorption wavelength band is added by the wavelength control layer 300, the external light reflectivity may be reduced.

In other words, according to embodiments of the disclosure, high-efficiency driving and high color gamut upon implementing white light may be achieved by adjusting, e.g., the light absorption peak wavelength or transmittance of the light absorption materials included in the wavelength control layer 300, and the external light reflectivity may be reduced by disposing the wavelength control layer 300.

Figure 8:
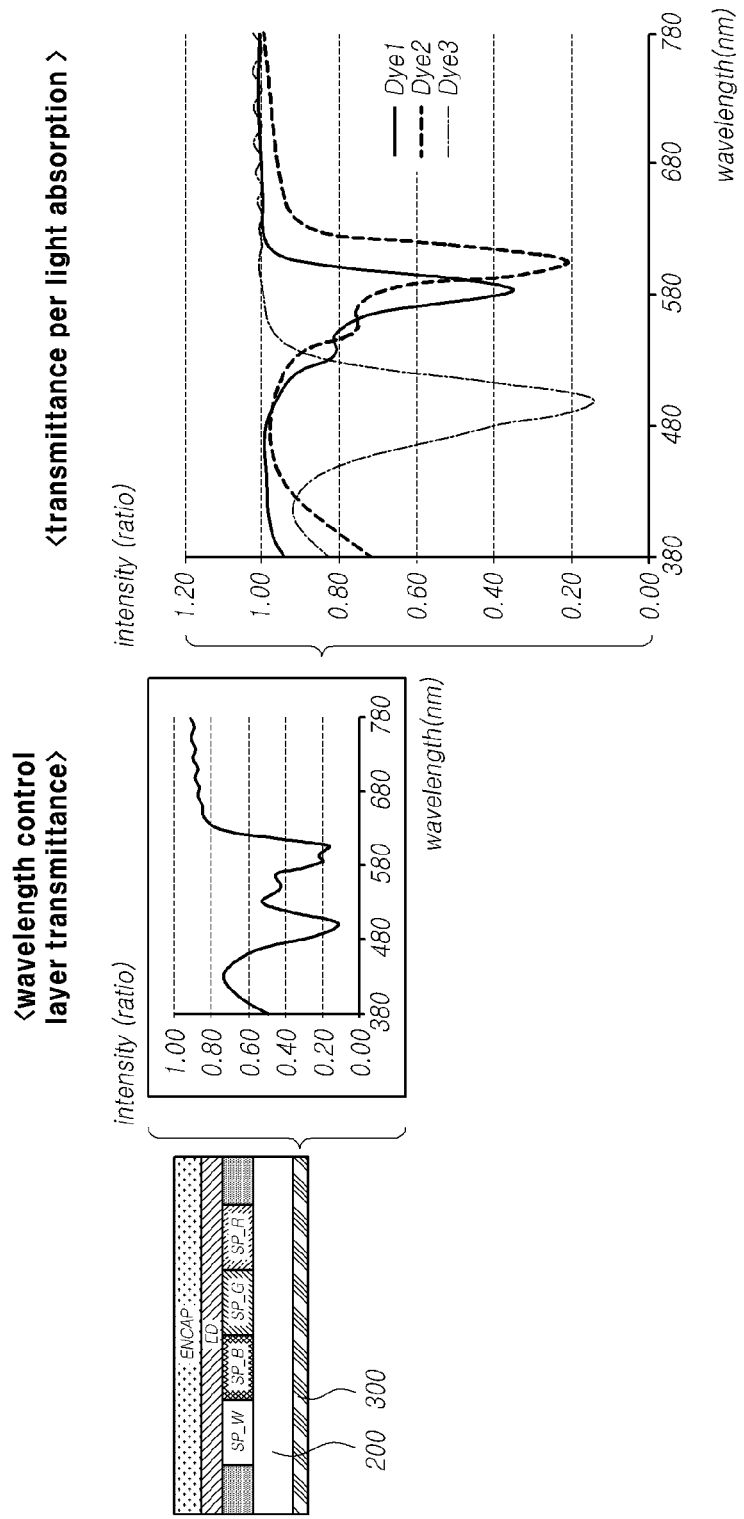
FIG. 8 is a view illustrating still another example light absorption spectrum of a wavelength control layer according to embodiments of the disclosure.

FIG. 8 is a view illustrating another example light absorption spectrum of a wavelength control layer 300 according to embodiments of the disclosure.

Referring to FIG. 8, a transparent substrate 200 may be disposed on the path along which the light emitted from the subpixel SP of the display device 100 travels. A wavelength control layer 300 including a plurality of light absorption materials may be disposed on an outer surface of the transparent substrate 200.

The wavelength control layer 300 may include, e.g., three light absorption materials which may be light absorption dyes.

Here, a first light absorption material Dye1 may absorb light of a wavelength band ranging from 580 nm to 600 nm, and the transmittance for the light of the wavelength band ranging from 580 nm to 600 nm may be 36% to 40%. A second light absorption material Dye2 may absorb light of a wavelength band ranging from 590 nm to 610 nm, and the transmittance for the light of the wavelength band ranging from 590 nm to 610 nm may be 19% to 23%. A third light absorption material Dye3 may absorb light of a wavelength band ranging from 480 nm to 500 nm, and the transmittance for the light of the wavelength band ranging from 480 nm to 500 nm may be 13% to 17%.

As the wavelength control layer 300 includes the first light absorption material Dye1, the second light absorption material Dye2, and the third light absorption material Dye3, the light absorption spectrum represented by the wavelength control layer 300 may have a plurality of light absorption peak wavelengths. Further, the transmittance at each of the plurality of light absorption peak wavelengths may differ. Thus, the transmittance of the wavelength control layer 300 may be shown as in the example of FIG. 8.

Since the wavelength control layer 300 absorbs some wavelength band of light, a correction to the spectrum of the light emitted from the subpixel SP may be performed. Thus, when white light is implemented using the white subpixel SP_W, the color temperature may be corrected, and the color gamut may be increased.

Further, since the wavelength control layer 300 represents light absorption characteristics in a plurality of wavelength bands, the external light reflectivity may be lowered by placing the wavelength control layer 300. Thus, no polarization plate 400 may be disposed on the wavelength control layer 300.

In other words, as the wavelength control layer 300 includes a plurality of light absorption materials, it is possible to reduce the reflectivity of external light while enhancing the color gamut by correcting the color temperature of white light.

Figure 9:
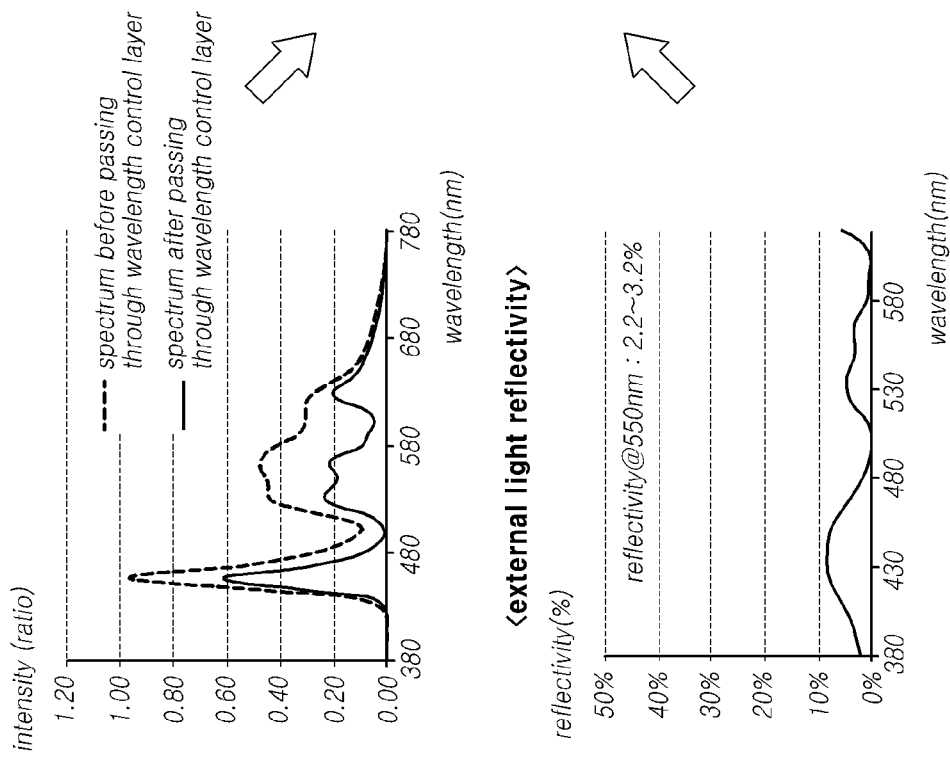
FIG. 9 is a view illustrating an example variation in spectrum before and after light is transmitted through the wavelength control layer of FIG. 8.

FIG. 9 is a view illustrating an example variation in spectrum before and after light is transmitted through the wavelength control layer 300 of FIG. 8.

Referring to FIG. 9, comparison between the spectrum of white light before passing through the wavelength control layer 300 and the spectrum of the white light after passing through the wavelength control layer 300 reveals that part of some wavelength band of light is absorbed, and a correction is made to the spectrum of the white light.

It may also be identified that the external light reflectivity is lowered by the wavelength control layer 300 including a plurality of light absorption materials. For example, the reflectivity for light of 550 nm may be identified to range from 2.2% to 2.3%.

Thus, as compared with when the polarization plate 400 is applied, when the wavelength control layer 300 is applied, the color temperature by the light emitting element ED may be enhanced, and white light may be implemented by driving the white subpixel SP_W. Thus, as compared with when other subpixel SP is driven to implement white light, the brightness at the same driving current may be enhanced.

Further, since an external light reflectivity similar to that when the polarization plate 400 is applied is provided when the wavelength control layer 300 is applied, the need for the polarization plate 400 may be eliminated by placing the wavelength control layer 300 capable of high-efficiency driving and achieving a high color gamut.

As such, according to embodiments of the disclosure, the wavelength control layer 300 disposed on the transparent substrate 200 may adjust the spectrum of light emitted from the display panel 110, enhancing the color gamut and driving efficiency, lowering the reflectivity of external light, and providing the functions of the polarization plate 400.

Various light absorption spectra as represented by the wavelength control layer 300 may be set considering, e.g., the characteristics of the light emitting element ED, the color temperature of white light to be implemented, or the reflectivity of external light.

Figure 10:
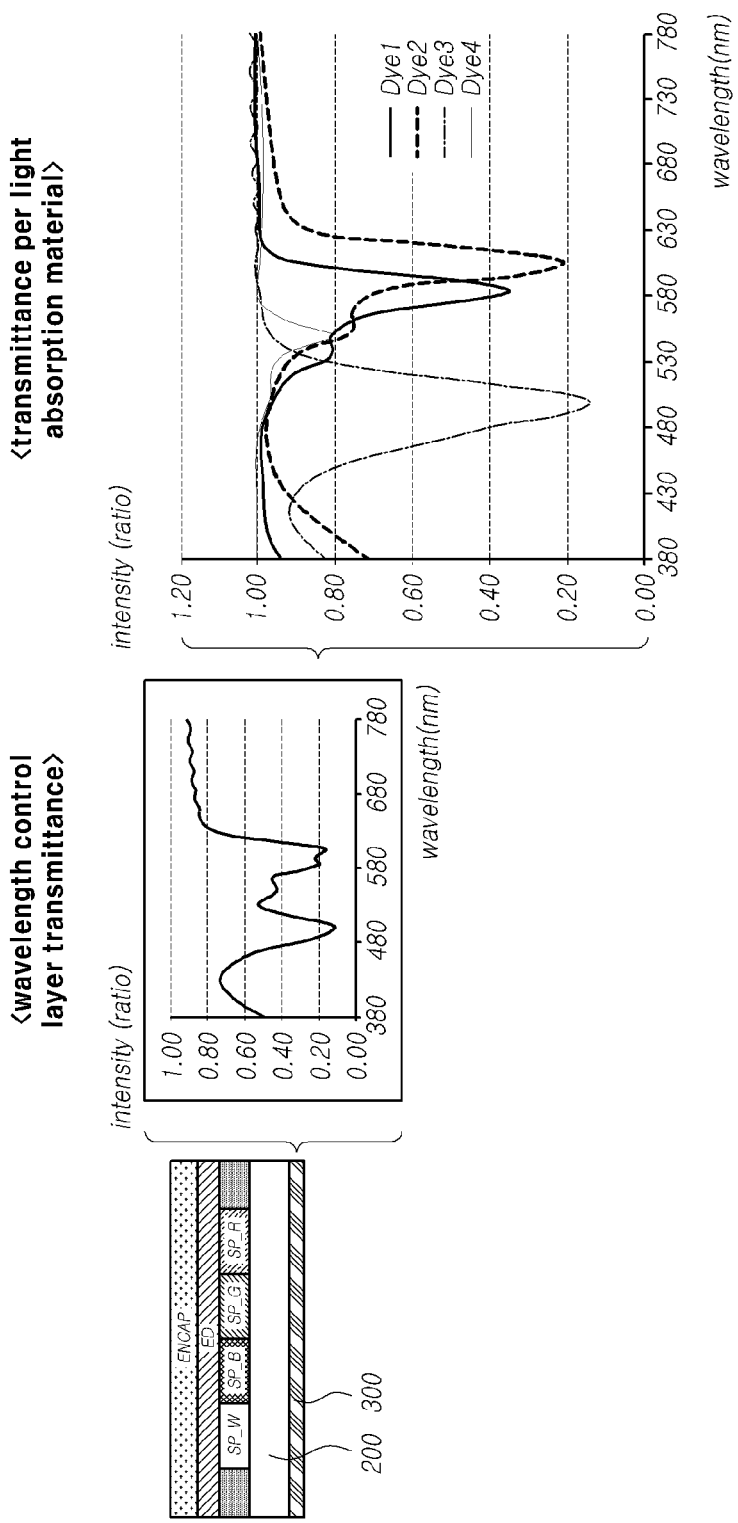
FIGS. 10 and 11 are views illustrating still another example light absorption spectrum of a wavelength control layer according to embodiments of the disclosure.
Figure 11:
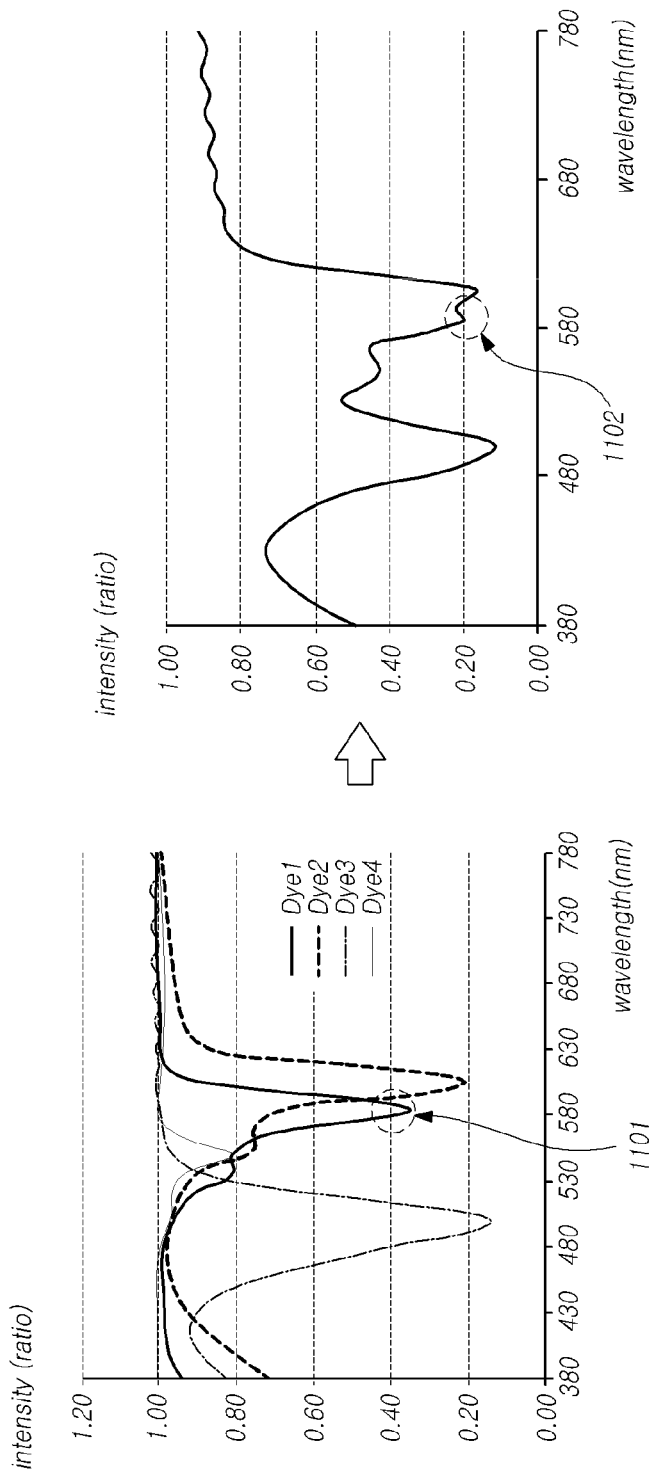

FIGS. 10 and 11 are views illustrating still another example light absorption spectrum of a wavelength control layer 300 according to embodiments of the disclosure.

Referring to FIGS. 10 and 11, the wavelength control layer 300 disposed on the transparent substrate 200 may include, e.g., four light absorption materials. The light absorption materials may be light absorption dyes.

A first light absorption material Dye1 may absorb light of a wavelength band ranging from 580 nm to 600 nm, and the transmittance for the light of the wavelength band ranging from 580 nm to 600 nm may be 36% to 40%. The first light absorption material Dye1 may be included to correct color temperature and reduce external light reflectivity.

A second light absorption material Dye2 may absorb light of a wavelength band ranging from 590 nm to 610 nm, and the transmittance for the light of the wavelength band ranging from 590 nm to 610 nm may be 19% to 23%. The second light absorption material Dye2 may be included to correct color temperature. As the wavelength control layer 300 includes the first light absorption material Dye1 and the second light absorption material Dye2 which absorb similar wavelength bands of light, the light absorption spectrum represented by the wavelength control layer 300 may have the transmittance in the wavelength band ranging from 580 nm to 610 nm further reduced. As an example, as the first light absorption material Dye1 is mixed with the second light absorption material Dye2, the transmittance in the absorption wavelength band of the first light absorption material Dye1 as denoted with 1101 may be further lowered as denoted with 1102. As such, considering a mixing of light absorption materials with similar light absorption wavelength bands, the transmittance of each light absorption material may be determined.

A third light absorption material Dye3 may absorb light of a wavelength band ranging from 480 nm to 500 nm, and the transmittance for the light of the wavelength band ranging from 480 nm to 500 nm may be 13% to 17%. The third light absorption material Dye3 may be included to correct color and reduce external light reflectivity.

A fourth light absorption material Dye4 may absorb light of a wavelength band ranging from 540 nm to 560 nm and may have a transmittance ranging from 78% to 82% for the light of the wavelength band ranging from 540 nm to 560 nm. The fourth light absorption material Dye4 may be included to supplement the external light reflectivity in a band of 550 nm.

As such, embodiments of the disclosure may correct color temperature and reduce external light reflectivity by adjusting the light absorption peak wavelength of the light absorption material included in the wavelength control layer 300 and the transmittance at the light absorption peak wavelength. For the light absorption material included in the wavelength control layer 300, the light absorption peak wavelength and transmittance may be set depending on the characteristics of the light absorption spectrum of the light emitting element ED.

Embodiments of the disclosure may further reduce the external light reflectivity by various structures in which the wavelength control layer 300 is disposed.

FIG. 12 is a view illustrating an example structure in which a wavelength control layer 300 is disposed according to embodiments of the disclosure.

Referring to FIG. 12, the wavelength control layer 300 may be disposed on the transparent substrate 200, and the wavelength control layer 300 may have different thicknesses (or heights) depending on positions.

As an example, a subpixel SP where a light emitting element ED is disposed may include a light emitting portion or light emitting area E/A where a color filter is disposed and light is emitted and an electrode portion E/P or circuit area C/A where a circuit element for driving the light emitting element ED is disposed.

The thickness of the wavelength control layer 300 disposed on the light emitting area E/A may differ from the thickness of the wavelength control layer 300 disposed on the circuit area C/A.

As in the example shown in FIG. 12, the largest thickness T1 of a first portion 300a of the wavelength control layer 300 disposed on the light emitting area E/A may be smaller than the largest thickness T2 of a second portion 300b of the wavelength control layer 300 disposed on the circuit area C/A.

In other words, the thickness (or height) of the wavelength control layer 300 disposed on the circuit area C/A may be larger than the thickness (or height) of the wavelength control layer 300 disposed on the light emitting area E/A.

Hence, the transmittance of the light absorption spectrum represented in the circuit area C/A may be lower than the transmittance of the light absorption spectrum represented in the light emitting area E/A.

Thus, the external light reflectivity of the display panel 110 may be implemented to be 1.X %, which is smaller than 2%, by reducing the transmittance of the wavelength control layer 300 disposed on the circuit area C/A which has a high external light reflectivity.

The external light reflectivity of the display panel 110 may further be lowered by disposing a layer with a lower transmittance than the wavelength control layer 300 in the area which has a high external light reflectivity.

FIG. 13 is a view illustrating another example structure in which a wavelength control layer 300 is disposed according to embodiments of the disclosure.

Referring to FIG. 13, the subpixel SP may include the light emitting area E/A and the circuit area C/A, and the wavelength control layer 300 may be disposed on the light emitting area E/A.

A light blocking layer 600 which represents a lower transmittance than the wavelength control layer 300 in the entire wavelength band may be disposed on the circuit area C/A. The light blocking layer 600 may be, e.g., a black ink.

The thickness T2 of the light blocking layer 600 may be larger than the thickness T1 of the wavelength control layer 300 to reduce external light reflectivity. Since the transmittance of the light blocking layer 600 itself is lower than that of the wavelength control layer 300, the thickness T2 of the light blocking layer 600 may be identical to or smaller than the thickness T1 of the wavelength control layer 300 depending on, e.g., adjustment of transmittance or processing convenience.

As such, the external light reflectivity may further be lowered by placing the light blocking layer 600 on the circuit area C/A of the subpixel SP which has high external light reflectivity in the display panel 110.

Thus, the external light reflectivity of the display panel 110 may be implemented to be 1% or less by reducing the external light reflectivity while controlling the spectrum of the light emitted through the wavelength control layer 300.

The above-described wavelength control layer 300 may be disposed on the transparent substrate 200 in various manners.

FIG. 14 is a view illustrating example schemes of disposing a wavelength control layer 300 according to embodiments of the disclosure.

Referring to FIG. 14, the wavelength control layer 300 in the form of a film may be disposed on the transparent substrate 200 as in example 1 (EX1). In other words, the wavelength control layer 300 may be implemented in the form of a wavelength control film.

The wavelength control layer 300 may include, e.g., a protection layer 310, a light absorption layer 320, and an adhesion layer 330. The protection layer 310 may be formed of, e.g., a transparent material, such as polyethylene terephthalate (PET), and the light absorption layer 320 may include at least one light absorption material.

The wavelength control layer 300 may be disposed on the transparent substrate 200 by printing using an inkjet printer as in example 2 (EX2). In other words, the wavelength control layer 300 including the light absorption material may be applied onto the transparent substrate 200.

The wavelength control layer 300 may be disposed in other various ways than those described above, and the light absorption spectrum represented by the wavelength control layer 300 may be set to be able to lower the external light reflectivity while raising the color gamut by the wavelength control layer 300.

As set forth above, according to embodiments of the disclosure, the wavelength control layer 300 absorbing part of light of a specific wavelength band is disposed on the path along which light is emitted from the display panel 110. Thus, upon implementing white light via correction of the color temperature of white light, high-efficiency driving and high color gamut may be achieved.

Also possible is wavelength control considering, e.g., the characteristics of the light emitting element ED via adjustment of the light absorption spectrum represented by the wavelength control layer 300.

The external light reflectivity may be further reduced by the structure of disposing the wavelength control layer 300 or adjusting the light absorption spectrum of the wavelength control layer 300 and, thus, the function of the polarization plate 400 may be replaced while enhancing the color gamut.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

What is claimed is:

1. A display device, comprising:
    a plurality of subpixels including a light emitting area and a circuit area;
    a transparent substrate positioned on a path along which light from the plurality of subpixels is emitted to outside of the display device; and
    a wavelength control layer disposed in at least a partial area on the transparent substrate and including a plurality of light absorption materials, each of the plurality of light absorption materials representing a light absorption spectrum with a light absorption peak wavelength, and the plurality of light absorption materials having different light absorption peak wavelengths and different transmittances at the light absorption peak wavelength.

2. The display device of claim 1, wherein at least one of the plurality of light absorption materials absorbs at least a portion of a wavelength band of light other than blue light.

3. The display device of claim 1, wherein the wavelength control layer includes at least one light absorption material of a first light absorption material absorbing at least a portion of light of a wavelength band ranging from 580 nm to 600 nm, a second light absorption material absorbing at least a portion of light of a wavelength band ranging from 590 nm to 610 nm, a third light absorption material absorbing at least a portion of light of a wavelength band ranging from 480 nm to 500 nm, and a fourth light absorption material absorbing at least a portion of light of a wavelength band ranging from 540 nm to 560 nm.

4. The display device of claim 1, wherein the wavelength control layer includes a first portion positioned on the light emitting area and a second portion positioned on the circuit area, and wherein a largest thickness of the first portion is smaller than a largest thickness of the second portion.

5. The display device of claim 1, wherein the wavelength control layer is positioned on the light emitting area, and wherein
    the display device further comprises a light blocking layer disposed on the circuit area and having a lower transmittance than the wavelength control layer.

6. The display device of claim 5, wherein a largest thickness of the wavelength control layer is smaller than a largest thickness of the light blocking layer.

7. The display device of claim 1, wherein the plurality of subpixels include a white subpixel, a red subpixel, a green subpixel, and a blue subpixel, and wherein
    when white is displayed using the white subpixel, the red subpixel, the green subpixel, and the blue subpixel, a driving current is supplied to the white subpixel, and supply of a driving current to remaining subpixels except for the white subpixel is cut off.

8. The display device of claim 1, wherein at least one of a planarization layer and a protection layer is further disposed on the wavelength control layer.

9. A display device, comprising:
    a plurality of subpixels including a white subpixel, a red subpixel, a green subpixel, and a blue subpixel, a light emitting element disposed in each of the plurality of subpixels;

a transparent substrate positioned on a path along which light from the plurality of subpixels is emitted to outside of the display device; and a wavelength control layer disposed on the transparent substrate and on the white subpixel and including a plurality of light absorption materials, the plurality of light absorption materials having different light absorption peak wavelengths and different transmittances at the light absorption peak wavelength.

10. The display device of claim 9, wherein the each of the plurality of light absorption materials absorbs at least a portion of a wavelength band of light other than blue light.

11. The display device of claim 9, wherein the wavelength control layer disposed on the white subpixel is not smaller in size than a light emitting area of the white subpixel.

12. The display device of claim 9, further comprising:
a polarization plate positioned on the wavelength control layer; and
a planarization layer disposed between the wavelength control layer and the polarization plate, and between the transparent substrate and the polarization plate.

13. The display device of claim 9, wherein a number of peak wavelengths of a spectrum represented by light transmitted through the wavelength control layer is not less than a number of peak wavelengths of a spectrum represented by light emitted from the white subpixel.

14. The display device of claim 9, wherein when white is displayed using the white subpixel, the red subpixel, the green subpixel, and the blue subpixel, a driving current is supplied to the white subpixel, and supply of a driving current to remaining subpixels except for the white subpixel is cut off.

15. A display device, comprising:
a plurality of subpixels including a light emitting area and a circuit area; a transparent substrate positioned on a path along which light from the plurality of subpixels is emitted to outside of the display device; a wavelength control layer disposed in at least a partial area on the transparent substrate and including at least one light absorption material, each of the at least one light absorption material representing a light absorption spectrum with a light absorption peak wavelength; and at least one of a planarization layer and a protection layer is further disposed on the wavelength control layer, wherein a number of peak wavelengths of a spectrum represented by light transmitted through the wavelength control layer is not less than a number of peak wavelengths of a spectrum represented by light emitted from a white subpixel of the plurality of subpixels.

16. A wavelength control film, comprising:

a first light absorption material absorbing at least a portion of light of a first wavelength band; and a second light absorption material absorbing at least a portion of light of a second wavelength band different from the first wavelength band, wherein a transmittance of the first light absorption material, for the light of the first wavelength band, differs from a transmittance of the second light absorption material, for the light of the second wavelength band.

* * * * *